(12) United States Patent
Ueno et al.

(10) Patent No.: US 6,897,523 B2
(45) Date of Patent: May 24, 2005

(54) SEMICONDUCTOR DEVICE

(75) Inventors: Shuichi Ueno, Tokyo (JP); Haruo Furuta, Tokyo (JP); Shigehiro Kuge, Tokyo (JP); Hiroshi Kato, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/211,705

(22) Filed: Aug. 5, 2002

(65) Prior Publication Data

US 2003/0151086 A1 Aug. 14, 2003

(30) Foreign Application Priority Data

Feb. 13, 2002 (JP) ........................................ 2002-035082

(51) Int. Cl.$^7$ ...................... H01L 29/788; H01L 21/336
(52) U.S. Cl. ...................... 257/324; 257/321; 257/325; 257/326; 438/261; 438/263; 438/264
(58) Field of Search ................................ 257/315–317, 257/319, 321, 324–326; 438/261, 263, 257, 264, 364, 259, 265, 266

(56) References Cited

U.S. PATENT DOCUMENTS

| 4,954,731 A | 9/1990 | Dhong et al. |
| 5,768,192 A | 6/1998 | Eitan |

FOREIGN PATENT DOCUMENTS

| CN | 1018416 B | 9/1992 |
| JP | 6-85184 | 3/1994 |

OTHER PUBLICATIONS

J. De Blauwe, et al. "Si–Dot Non–Volatile Memory Device", Extended Abstracts of the 2001 International Conference on Solid State Devices and Materials, Tokyo, 2001, pp. 518–519.

*Primary Examiner*—Donghee Kang
(74) *Attorney, Agent, or Firm*—Oblon, Spivak, McClelland, Maier & Neustadt, P.C.

(57) ABSTRACT

A semiconductor device is provided which includes a diode formed of a MISFET and having a current-voltage characteristic close to that of an ideal diode. Negatively charged particles (e.g. electrons: 8a) are trapped on the drain region (2) side of a silicon nitride film (4b) sandwiched between films of silicon oxide (4a, 4c). When a bias voltage is applied between the drain and source with the negatively charged particles (8a) thus trapped and in-channel charged particles (9a) induced by them, the MISFET exhibits different threshold values for channel formation depending on whether it is a forward bias or a reverse bias. That is to say, when a reverse bias is applied, the channel forms insufficiently and the source-drain current is less likely to flow, while the channel forms sufficiently and a large source-drain current flows when a forward bias is applied. This offers a current-voltage characteristic close to that of the ideal diode.

18 Claims, 17 Drawing Sheets

SEMICONDUCTOR DEVICE

BACKGROUND OF THE INVENTION

1. Field of the Invention

The present invention relates to a semiconductor device which uses a MISFET (Metal Insulator Semiconductor Field Effect Transistor) as a diode.

2. Description of the Background Art

FIG. 37 shows a schematic symbol which represents the diode. As is well known, the diode permits current flow in the forward direction (FWD direction) from the anode (A) to the cathode (K) but inhibits current flow in the reverse direction (REV direction) from the cathode (K) to the anode (A).

While specific methods for forming diodes include methods utilizing the PN junction or the Schottky barrier, a diode using a MISFET is described herein.

FIG. 38 is a diagram that illustrates a diode using a MISFET. As shown in FIG. 38, the gate G and the drain D of the MISFET are short-circuited together so that the gate G and the drain D function as the anode and the source S functions as the cathode. In FIG. 38, the body B of the MISFET is grounded.

In the case of the diode using a MISFET, its current-voltage characteristic varies depending on the value of the threshold Vth for formation of the channel in the MISFET. FIG. 39 is a graph that shows two current-voltage characteristics G2 and G3 with different threshold values Vth. The characteristic G2 has Vth=0 [V] and the characteristic G3 has Vth=2 [V]. The vertical axis in FIG. 39 shows the drain-source current $I_D$ and the horizontal axis shows the drain-source voltage $V_D$ (in the diode configuration, the voltage $V_D$ is also the gate-source voltage $V_G$ since the drain and the gate are short-circuited).

Now, in the diode, it is ideal that the current infinitely flow when it is forward (FWD) biased and the current is zero when reverse (REV) biased. Accordingly, in the graph of FIG. 39, it is desired that the current-voltage characteristic steeply rise when forward-biased, i.e. in the FWD region where $V_D \geq 0$.

That is, this means that the characteristic G2 with threshold Vth=0 [V] is preferable to the characteristic G3 with threshold Vth=2 [V]. With the forward bias, while the characteristic G3 involves a voltage loss because it needs application of an extra amount of gate-source voltage $V_G$ for the threshold Vth=2 [V], the characteristic G2 does not involve such a voltage loss.

In the MISFET, the threshold Vth can be varied in accordance with parameters such as the impurity concentration in the channel region, the dielectric constant of the substrate material, etc. It is therefore easy to realize the characteristic G2 by adjusting such parameters.

However, in the case of the characteristic G2, a leakage current $I_L$ flows even when the voltage $V_D$ is zero. Furthermore, even with the reverse (REV direction) bias, the influence of the leakage current $I_L$ remains when the voltage $V_D$ is near zero.

For use as a diode, the leakage current occurring when the reverse bias is applied must be suppressed below a given standard value. Therefore the characteristic G2 cannot be adopted and the threshold Vth must be set at larger value as that of the characteristic G3.

SUMMARY OF THE INVENTION

An object of the present invention is to provide a semiconductor device including a diode formed with a MISFET and having a current-voltage characteristic close to that of an ideal diode.

According to the present invention, a semiconductor device includes a MISFET (Metal Insulator Semiconductor Filed Effect Transistor) which has: a gate insulating film formed on a semiconductor substrate; a gate electrode formed on the gate insulating film; and a drain region and a source region formed in a main surface of the semiconductor substrate with the gate insulating film located between the drain region and the source region.

In the semiconductor device, when no voltage is applied, in-channel charged particles are present in a channel formation region under the gate insulating film in the semiconductor substrate. The in-channel charged particles differ in at least one of conductivity type and amount of charge between the drain region side and the source region side in the channel formation region. The gate electrode and the drain region are short-circuited.

In-channel charged particles are present in the channel formation region when no voltage is applied and the in-channel charged particles at least differ in one of type and amount of charge on the drain region side and the source region side of the channel formation region. Therefore the channel forms insufficiently when a reverse bias is applied and the source-drain current is less likely to flow, while the channel sufficiently forms when a forward bias is applied and the source-drain current can flow smoothly. That is to say, the semiconductor device effectively blocks the flow of drain-source current when reverse-biased and permits a larger flow of drain-source current when forward-biased. A semiconductor device is thus provided which includes a diode formed of MISFET and having a current-voltage characteristic close to that of an ideal diode.

These and other objects, features, aspects and advantages of the present invention will become more apparent from the following detailed description of the present invention when taken in conjunction with the accompanying drawings.

DESCRIPTION OF THE PREFERRED EMBODIMENTS

<Basic Principle>

The basic principle of the invention is now described before describing the preferred embodiments of the invention.

Figure 1:
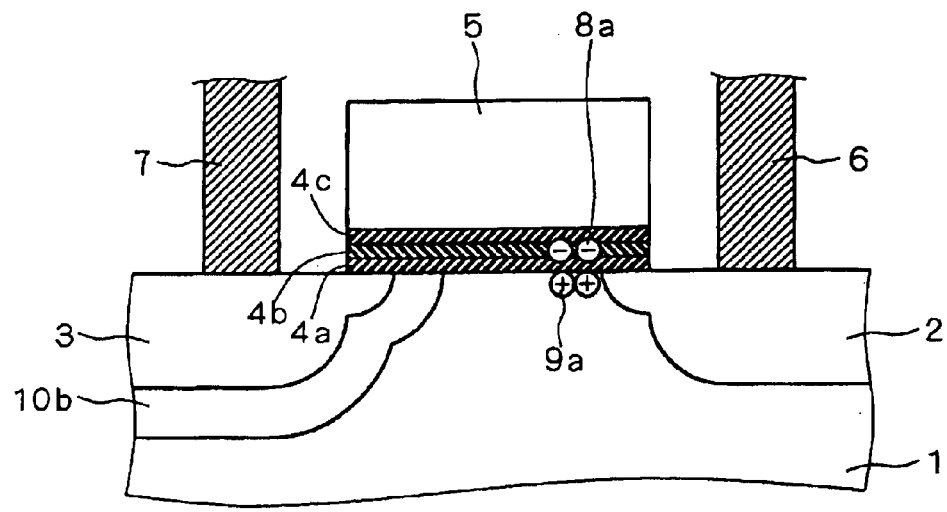
FIG. 1 is a diagram that shows the structure of a MISFET constituting a nonvolatile semiconductor memory described in U.S. Pat. No. 5,768,192.

FIG. 1 is a diagram showing the structure of a MISFET that forms a nonvolatile semiconductor memory described in U.S. Pat. No. 5,768,192. As shown in FIG. 1, this MISFET has stacked gate insulating films 4a to 4c formed on a semiconductor substrate 1, e.g. a silicon substrate, a gate electrode 5 formed on the gate insulating film 4c, and a drain region 2 and a source region 3 formed in the main surface of the semiconductor substrate 1 with the gate insulating films 4a to 4c located between them. Contact plugs 6 and 7 are connected to the drain region 2 and the source region 3, respectively. The gate insulating films 4a to 4c have a stacked-layer structure of a silicon oxide film 4a, a silicon nitride film 4b, and a silicon oxide film 4c. This diagram shows an example in which the MISFET is of n-channel type, where the semiconductor substrate is p type and the drain region 2 and the source region 3 are both n type.

In this MISFET, negatively charged particles (e.g. electrons) 8a are trapped in the silicon nitride film 4b on the side of the drain region 2. When no voltage is applied, the trapped negatively-charged particles 8a induce positively charged particles (e.g. holes) 9a in the channel formation region in the semiconductor substrate 1. Since the negatively charged particles 8a are trapped only in the vicinity of the drain region 2, the positively charged particles 9a do not appear on the side of the source region 3. Thus the in-channel charged particles 9a differ in amount of charge between the drain region 2 side and the source region 3 side.

Figure 2:
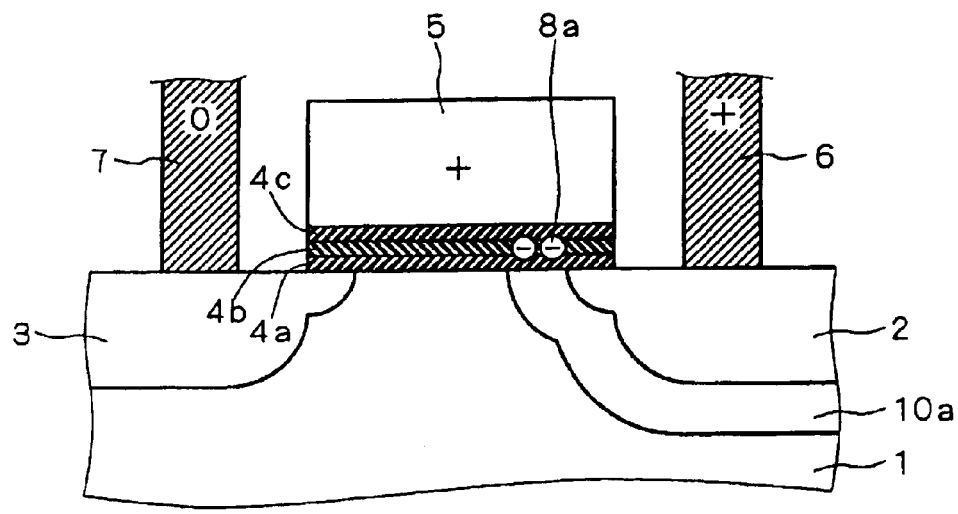
FIG. 2 is a diagram that shows the MISFET of FIG. 1 in which a forward bias voltage is applied between the drain and source.
Figure 3:
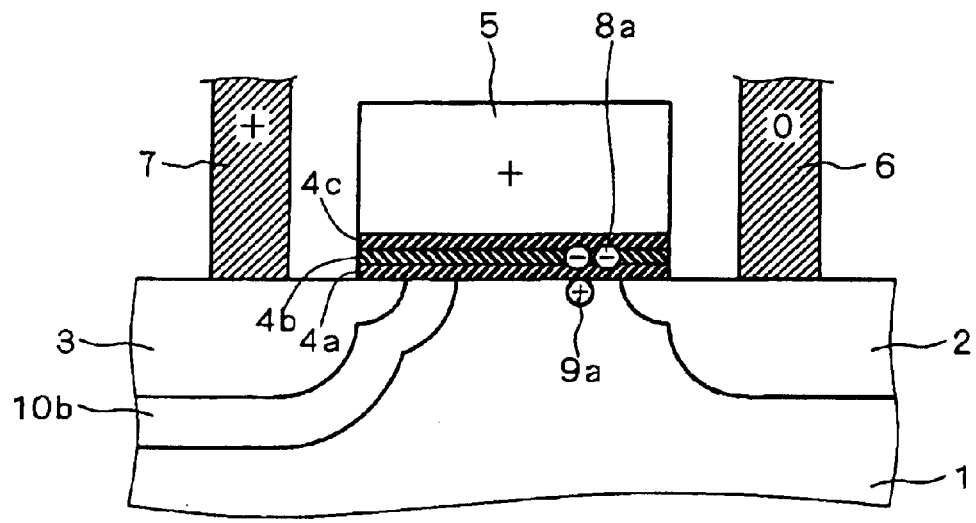
FIG. 3 is a diagram that shows the MISFET of FIG. 1 in which a reverse bias voltage is applied between the drain and the source.

When a bias voltage is applied between the drain and the source with the negatively charged particles 8a trapped and the in-channel charged particles 9a induced as explained above, the threshold value for channel formation of the MISFET varies depending on whether it is a forward bias or a reverse bias. FIGS. 2 and 3 illustrate this phenomenon.

As shown in FIG. 2, when a forward bias voltage (i.e. a voltage which causes the potential to be higher at the drain than at the source) is applied between the drain and the source (In FIG. 2, "0" indicates 0 [V] and "+" indicates positive voltage value), then a depletion layer 10a forms at the pn junction between the drain region 2 and the semiconductor substrate 1. The formation of the depletion layer 10a causes the induced in-channel charged particles 9a to disappear.

In this state, when a forward bias voltage (i.e. a voltage that causes the potential to be higher at the gate than at the source) is applied between the gate and the source, then an n-type channel forms in the channel formation region in the semiconductor substrate 1 right under the gate insulating films 4a to 4c and a drain-source current $I_D$ flows. At this time, the in-channel charged particles 9a, which have been canceled by the depletion layer 10a, exert no influence on the formation of the n-type channel.

On the other hand, as shown in FIG. 3, when a reverse bias voltage (i.e. a voltage which causes the potential to be higher at the source than at the drain) is applied between the drain and the source (in FIG. 3, too, "0" indicates 0 [V] and "+" indicates positive voltage value), a depletion layer 10b forms at the pn junction between the source region 3 and the semiconductor substrate 1.

In this state, when a voltage that causes the potential to be higher at the gate than at the drain is applied between the gate and drain, then the structure looks as if the functions of the drain and the source in FIG. 2 have been replaced by each other.

In this case, however, the induced in-channel charged particles 9a still remain since the depletion layer 10a is not formed at the pn junction between the drain region 2 and the semiconductor substrate 1. However, because the voltage is applied between the gate and the drain, the electric field of the in-channel charged particles 9a is somewhat weakened by the effect of the charge stored in the gate electrode 5. FIG. 3 shows this condition by reducing the number of symbols representing the in-channel charged particles 9a.

As the in-channel charged particles 9a remain, the n-type channel expands from the source region 3 only to the position of the in-channel charged particles 9a, without reaching the drain region 2. That is to say, the n-type channel formation is imperfect and the flow of source-drain current is suppressed.

Completely canceling the in-channel charged particles 9a thus requires a higher gate-drain voltage. This means that the channel formation threshold of the MISFET varies depending on whether the forward or reverse bias is applied between the drain and the source.

Needless to say, without the negatively charged particles 8a trapped and hence without the in-channel charged particles 9a induced, then the threshold value will remain equal in the conditions of FIG. 2 and FIG. 3. The technique described in the U.S. Pat. No. 5,768,192 applies this property to a nonvolatile memory device, where whether the negatively charged particles 8a are trapped or not is read on the basis of the difference in threshold that takes place when the reverse bias voltage is applied.

Now, in this invention, the drain and the gate of the MISFET of FIG. 1 are short-circuited for use as a diode. The technique of short-circuiting the drain and gate of MISFET to form a diode has conventionally been in wide use. However, forming a diode with the MISFET shown in FIG. 1 provides unique effects of the invention which cannot be obtained by diode-connecting a MISFET in which the negatively charged particles 8a are not trapped. This is now described.

First, when the drain and the gate of the MISFET of FIG. 1 are short-circuited and the forward bias voltage is applied between the drain and the source, then the condition of FIG. 2 is produced and the depletion layer 10a is formed. The formation of the depletion layer 10a causes the induced in-channel charged particles 9a to disappear.

Since the gate is short-circuited to the drain, an n-type channel is formed in the channel formation region in the semiconductor substrate 1. The drain-source current $I_D$ thus flows. The in-channel charged particles 9a exert no influence on the n-type channel formation since they have been canceled by the depletion layer 10a.

Figure 4:
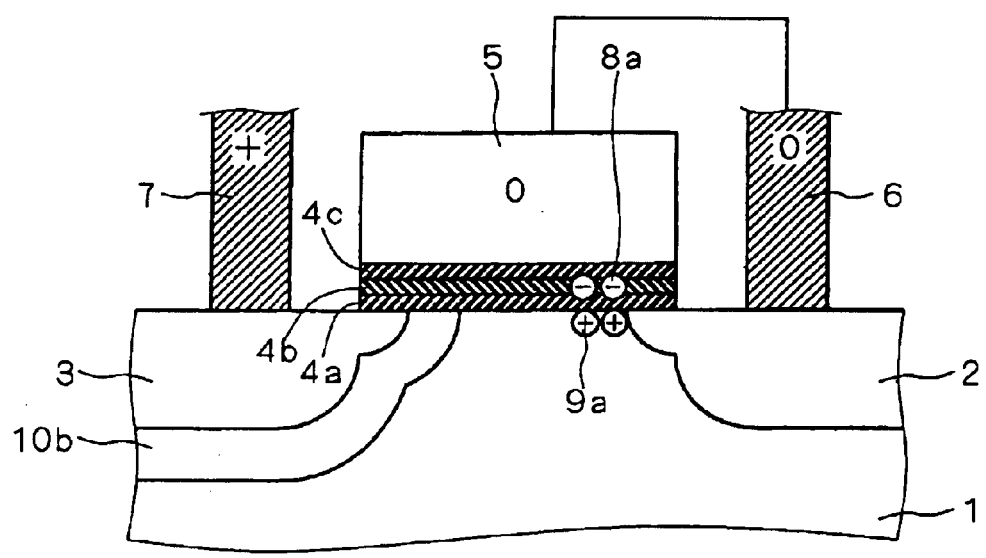
FIG. 4 is a diagram that shows the MISFET of FIG. 1 in which a reverse bias voltage is applied between the drain and the source with its drain and gate short-circuited.

On the other hand, with the drain and the gate of the MISFET of FIG. 1 short-circuited, the application of the reverse bias voltage between the drain and the source produces the condition shown in FIG. 4. That is to say, the potential at the gate, which is short-circuited to the drain, is equal to the drain potential, with the source potential higher than the drain potential (in FIG. 4, too, "0" indicates 0 [V] and "+" indicates positive voltage value).

In this case, the induced in-channel charged particles 9a still remain since the depletion layer 10a is not formed at the pn junction between the drain region 2 and the semiconductor substrate 1. Furthermore, no potential difference exists between the gate and the drain and no charge is stored in the gate electrode 5, so that the electric field of the in-channel charged particles 9a is not weakened.

That is to say, the in-channel charged particles 9a remain unchanged from the condition of FIG. 1 where no voltage is applied, which more effectively inhibits the n-type channel from reaching the drain region 2. That is, the n-type channel is formed more insufficiently and the source-drain current is still less likely to flow.

The phenomenon above shows that the diode-connected MISFET of FIG. 1 has a property extremely suitable for a diode. That is, when forward-biased, it permits the drain-source current $I_D$ to flow without inhibiting the channel formation, and when reverse-biased, it inhibits the channel formation and blocks the flow of drain-source current $I_D$.

Figure 5:
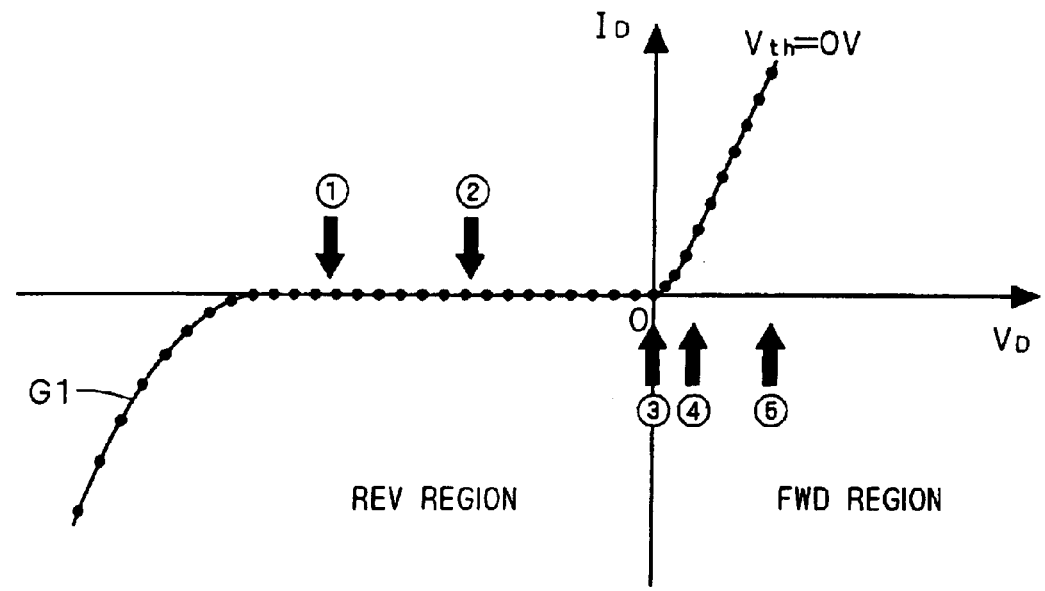
FIG. 5 is a graph that shows experimental results about the current-voltage characteristic of the diode-connected MISFET of FIG. 1.

FIGS. 5 to 10 illustrate this phenomenon in greater detail. FIG. 5 is a graph that shows experimental results about the current-voltage characteristic of the diode-connected MISFET of FIG. 1. In FIG. 5, the vertical axis shows the drain-source current $I_D$ and the horizontal axis shows the drain-source voltage $V_D$ (which is also the gate-source voltage $V_G$). The threshold is set as Vth=0 [V] in this current-voltage characteristic G1.

FIGS. 6 to 10 show the states of the in-channel charged particles and the depletion layers at the points (1) to (5) in FIG. 5.

Figure 6:
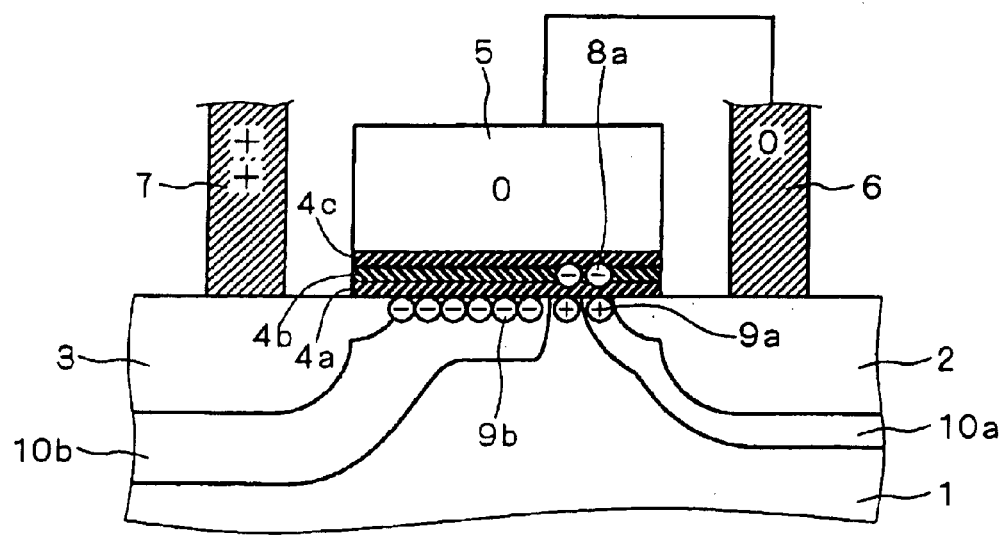
FIGS. 6 to 10 are diagrams that show conditions of in-channel charged particles and depletion layers at the points 1 to 5 in FIG. 5, respectively.

FIG. 6 shows a state in which a relatively strong reverse (REV direction) bias voltage is applied (at the point (1)), where the depletion layer 10b on the side of the source region 3 extends in a large area. Because the threshold Vth is set at 0 [V], in-channel negatively-charged particles 9b exist and the channel is formed halfway even though the gate voltage is 0 [V]. However, the presence of the in-channel positively-charged particles 9a inhibits the channel from reaching the drain region 2. Therefore the drain-source current $I_D$ is approximately zero.

Figure 7:
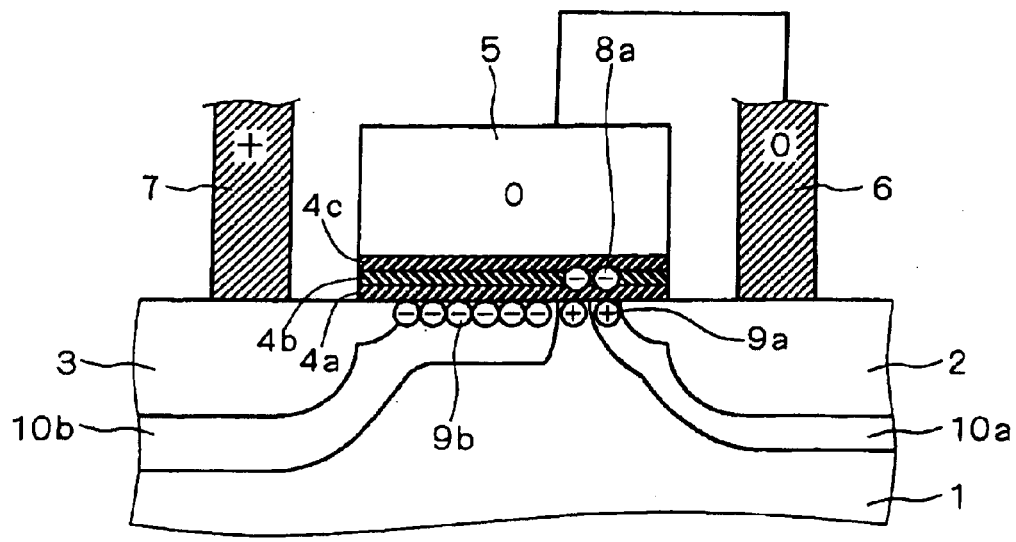

FIG. 7 shows a state in which a reverse bias voltage weaker than that of FIG. 6 is applied (at the point (2)), where the depletion layer 10b on the side of the source region 3 does not extend in such a large area as shown in FIG. 6. In this case, too, the presence of the in-channel positively-charged particles 9a inhibits the channel from reaching the drain region 2. Therefore the drain-source current $I_D$ is approximately zero.

Figure 8:
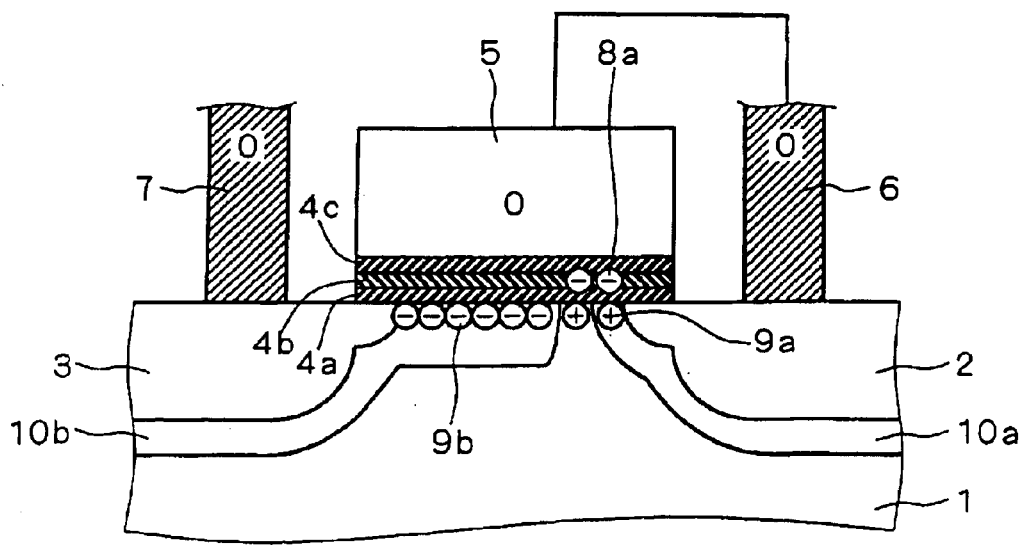

FIG. 8 shows the state in which the drain-source voltage $V_D$ is zero (the point (3)), where the depletion layer 10b on the side of the source region 3 extends as large as the depletion layer 10a on the side of the drain region 2. In this case, too, the presence of the in-channel positively-charged particles 9a inhibits the channel from reaching the drain region 2. Therefore the drain-source current $I_D$ is approximately zero.

Figure 38:
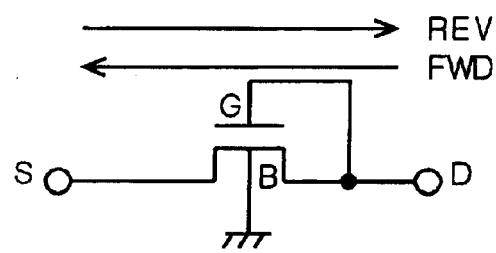
FIG. 38 is a diagram that shows a conventional diode using a MISFET.
Figure 39:
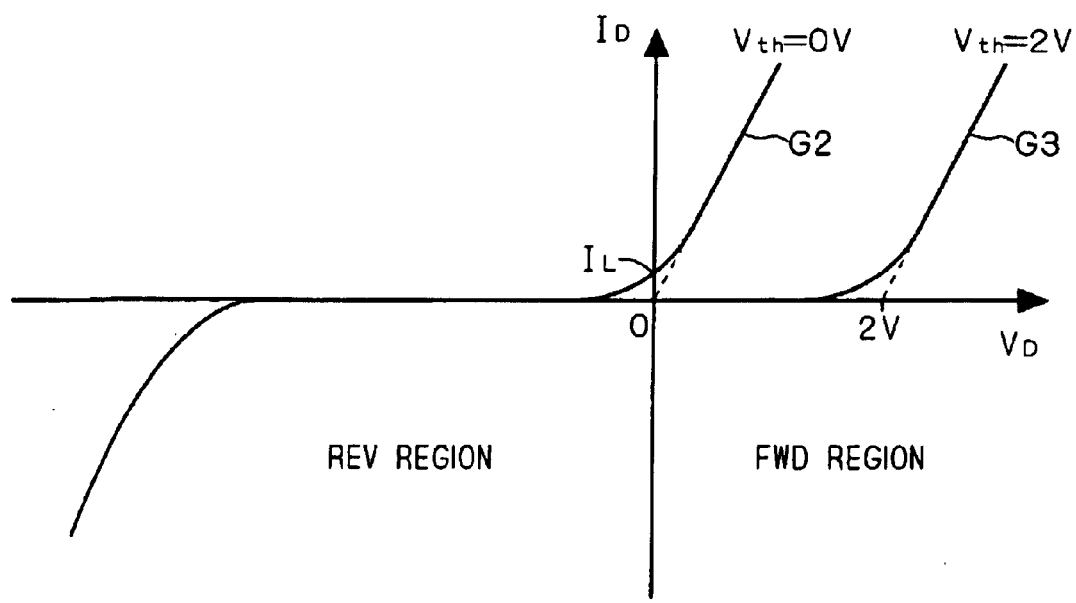
FIG. 39 is a graph that shows two current-voltage characteristics G2 and G3 with different thresholds Vth of the diode using MISFET.

Now, referring back to the graph of FIG. 39, the leakage current $I_L$ is present when the threshold Vth=0 [V] in the conventional diode-connected MISFET shown in FIG. 38. However, in FIG. 8, the drain-source current $I_D$ can be suppressed to approximately zero because of the in-channel positively-charged particles 9a induced.

Figure 9:
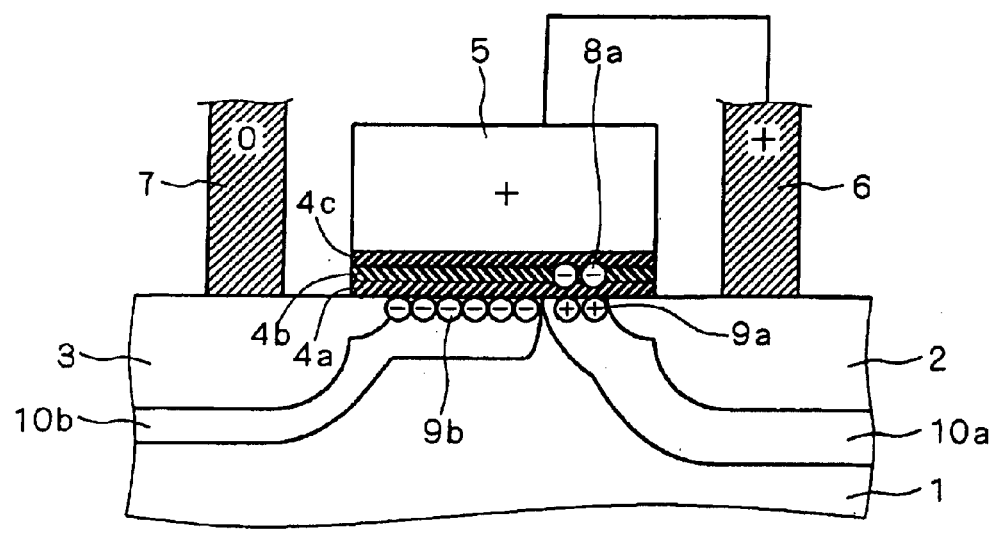

FIG. 9 shows a state in which a forward (FWD direction) bias voltage is applied (the point (4)), where the depletion layer 10a on the side of the drain region 2 is starting expanding. At this time, the in-channel positively-charged particles 9a are gradually canceled by the expanding depletion layer 10a and the channel gradually expands from the in-channel negatively-charged particles 9b toward the drain region 2 (note that in FIG. 9 the in-channel charged particles 9a are intentionally depicted without being deleted to show that the in-channel charged particles 9a had existed). Thus the drain-source current $I_D$ gradually increases.

Figure 10:
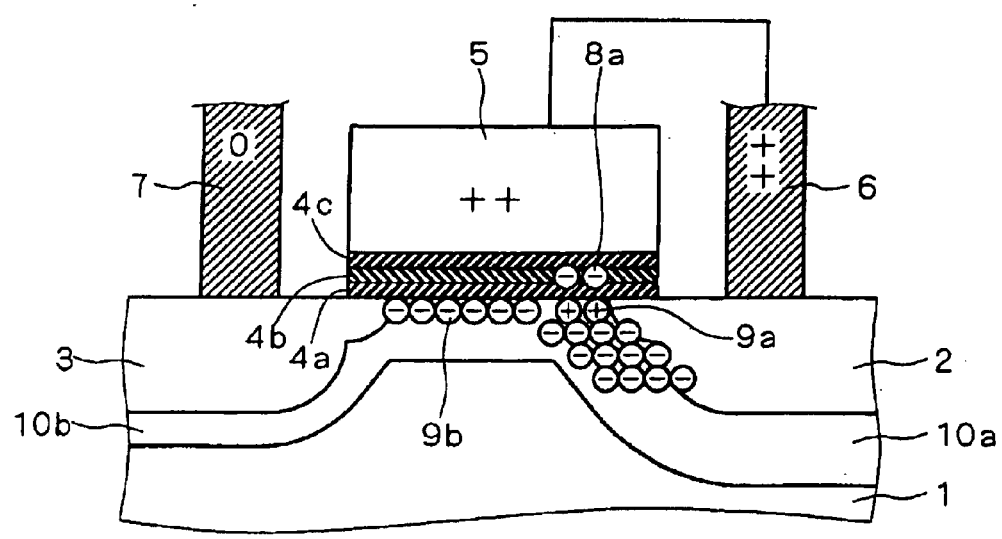

FIG. 10 shows a state in which the forward bias voltage is further applied (the point (5)), where the depletion layer 10a on the side of the drain region 2 has expanded in a large area. At this time, the in-channel positively-charged particles 9a have been canceled almost completely by the depletion layer 10a (note that in FIG. 10, too, the in-channel charged particles 9a are intentionally depicted without being deleted to show that the in-channel charged particles 9a had existed), and the channel completely reaches the drain region 2 and carrier electrons are introduced from the in-channel negatively-charged particles 9b into the drain region 2. Therefore a large drain-source current $I_D$ is flowing.

As explained above, as compared with the conventional diode-connected MISFET shown in FIG. 38, the diode-connected MISFET shown in FIG. 1 has a current-voltage characteristic which is closer to the characteristic of an ideal diode. This invention has been made on the basis of this basic principle.

Although the MISFET is n channel type in the example shown above, it is a matter of course that the same applies to a p-type channel MISFET to produce the same effects.

<First Preferred Embodiment>

Figure 11:
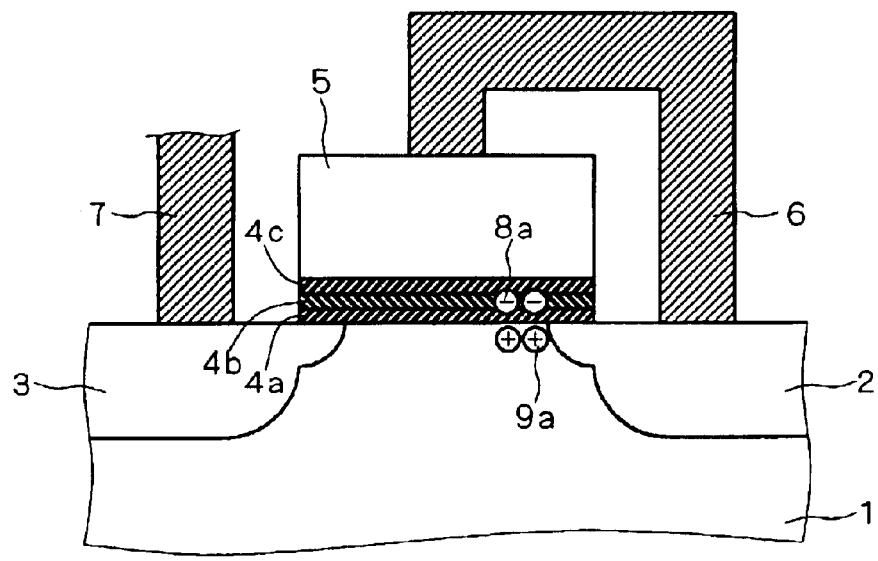
FIG. 11 is a diagram that shows a semiconductor device of a first preferred embodiment.

FIG. 11 is a diagram that shows a semiconductor device according to a first preferred embodiment of the invention. In FIG. 11, the elements having the same functions as those in the MISFET of FIG. 1 are shown by the same reference characters. That is to say, the semiconductor device of FIG. 11 is the same as that of FIG. 1 except that the diagram clearly shows that the gate electrode 5 and the drain region 2 are connected through the contact plug 6.

Figure 12:
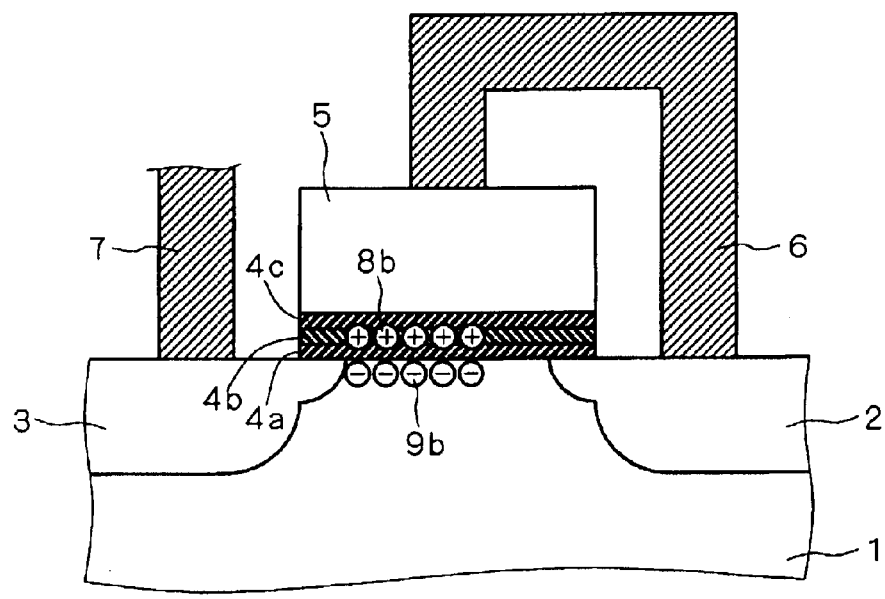
FIG. 12 is a diagram that shows another semiconductor device of the first preferred embodiment.

While the negatively charged particles 8a are trapped in the silicon nitride film 4b on the drain region 2 side in the semiconductor device of FIG. 11, positively charged particles 8b may be trapped on the source region 3 side as shown in FIG. 12. In this case, when no voltage is applied, the trapped positively-charged particles 8b induce negatively charged particles (e.g. electrons) 9b in the channel formation region in the semiconductor substrate 1. The in-channel charged particles 9b do not appear on the drain region 2 side since the positively charged particles 8b are trapped only in the vicinity of the source region 3. Thus the in-channel charged particles 9b differ in amount of charge between the drain region 2 side and the source region 3 side.

In this case, the channel is absent in the region where the in-channel charged particles 9b do not appear, i.e. the channel does not reach the drain region 2 when the drain-source voltage $V_D$ is zero. Therefore the drain-source current $I_D$ is approximately zero. Then, as the forward bias voltage is applied, the depletion layer starts expanding on the drain region 2 side, and a channel gradually forms in the region where the in-channel charged particles 9b are absent. Thus the semiconductor device operates in the same way as that shown in FIG. 11.

Figure 13:
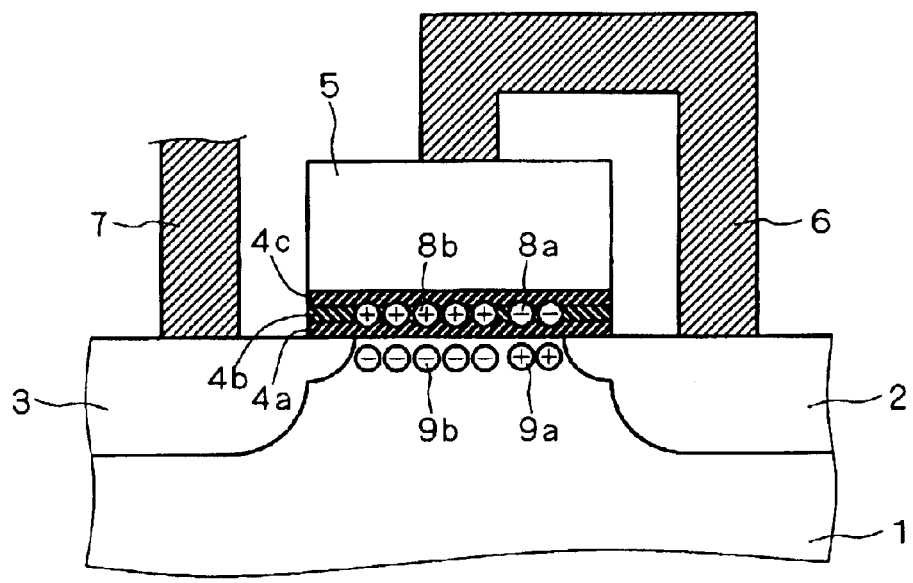
FIG. 13 is a diagram that shows another semiconductor device of the first preferred embodiment.

Also, as shown in FIG. 13, the positively charged particles 8b may be trapped on the source region 3 side in addition to those trapped in the semiconductor device of FIG. 11. In this case, the trapped negatively-charged particles 8a induce the in-channel positively-charged particles 9a in the channel formation region and the trapped positively-charged particles 8b induce the in-channel negatively-charged particles 9b in the channel formation region. Thus the in-channel charged particles differ in conductivity type between the drain region 2 side and the source region 3 side.

In this case, the structure looks as if the structures shown in FIGS. 11 and 12 are superimposed together, which more effectively blocks the drain-source current $I_D$ when reverse-biased and permits a larger flow of drain-source current $I_D$ when forward-biased.

A suitable structure can be chosen from among the structures shown in FIGS. 11 to 13 in accordance with the restrictions of parameters for setting the threshold, such as the impurity concentration in the channel region, the dielectric constant of the substrate material, etc.

As shown above, when no voltage is applied, the in-channel charged particles 9a and/or 9b are present in the channel formation region in the semiconductor substrate 1 and the in-channel charged particles differ in conductivity type and/or amount of charge between the drain region 2 side and the source region 3 side in the channel formation region. Then the channel is formed insufficiently when a reverse bias is applied, which inhibits the flow of source-drain current. On the other hand, when a forward bias is applied, the channel is sufficiently formed to permit the source-drain current to flow. That is to say, when reverse-biased, the device more effectively blocks the flow of the drain-source current $I_D$, and when forward-biased, it permits a larger flow of the drain-source current $I_D$. Hence a semiconductor device is obtained which contains a MISFET diode having a current-voltage characteristic closer to that of the ideal diode.

Also, as shown in FIG. 11, when the in-channel charged particles 9a located on the drain region side have a conductivity type different from that of the channel formed in the channel formation region (i.e. the channel is n type in the example and the charged particles are positive), it is then possible to certainly prevent the channel from reaching the drain region 2 when the drain-source voltage $V_D$ is zero. Accordingly, even when the threshold Vth is set to zero, the drain-source current $I_D$ can be suppressed to approximately zero.

In the semiconductor device of this preferred embodiment, the charged particles 8a and/or 8b trapped in the silicon nitride film 4b in the gate insulating film induce the in-channel charged particles. The in-channel charged particles can easily be induced since charged particles can be easily trapped in the gate insulating film by various methods, as will be described later.

Furthermore, in the semiconductor device of this preferred embodiment, the gate insulating film has a stacked-layer structure in which a silicon nitride film is sandwiched between silicon oxide films, with the charged particles trapped in the silicon nitride film. The charged particles trapped in the silicon nitride film 4b are not likely to leak but can be kept localized in a long period of time. Therefore a semiconductor device with excellent reliability can be obtained.

<Second Preferred Embodiment>

This preferred embodiment is a variation of the semiconductor device of the first preferred embodiment, where the gate insulating film is formed as a single-layer structure of a silicon oxide film, in place of the stacked-layer structure including a silicon nitride film.

Figure 14:
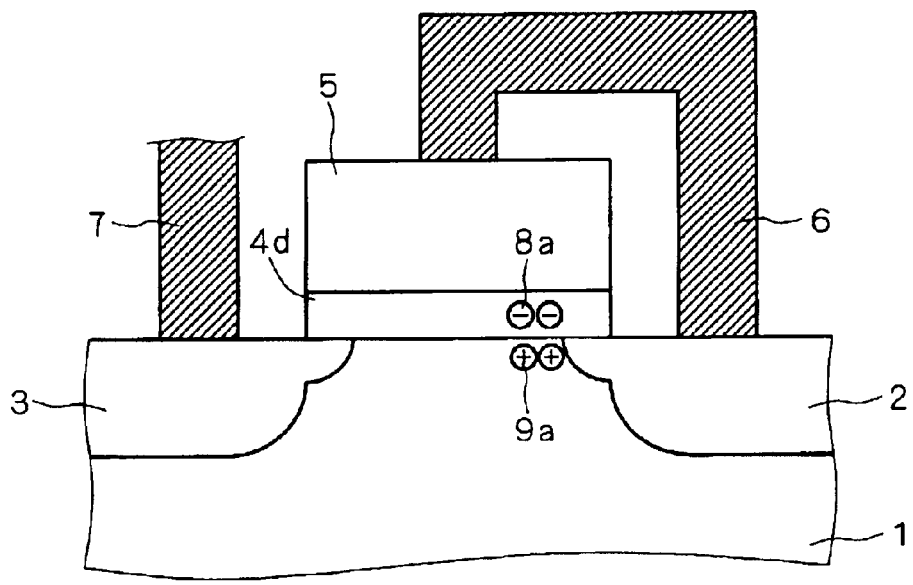
FIG. 14 is a diagram that shows a semiconductor device of a second preferred embodiment.

FIG. 14 is a diagram that shows a semiconductor device of this preferred embodiment. The structure shown in FIG. 14 is the same as that shown in FIG. 11 except that the gate insulating films 4a to 4c are replaced by a single-layer silicon oxide film 4d.

Though the silicon oxide film is inferior to the silicon nitride film in the ability of storing the charge, this structure offers basically the same functions and effects as that shown in the first preferred embodiment. Thus a semiconductor device including a MISFET diode having a current-voltage characteristic closer to that of the ideal diode can be obtained even when a silicon oxide film is adopted as the gate insulating film.

<Third Preferred Embodiment>

This preferred embodiment, too, is a variation of the semiconductor device of the first preferred embodiment, where a gate insulating film having a plurality of dots formed of silicon is adopted as the gate insulating film in place of the stacked-layer structure including the silicon nitride film.

A technique for forming silicon dots in a silicon oxide film is described in, for example, "Si-Dot Non-Volatile Memory Device," J. De Blauwe et al., Extended Abstracts of the 2001 International Conference on Solid State Devices and Materials, Tokyo, 2001, pp. 518–519. This preferred embodiment adopts a silicon oxide film having such silicon dots as the gate insulating film.

Figure 15:
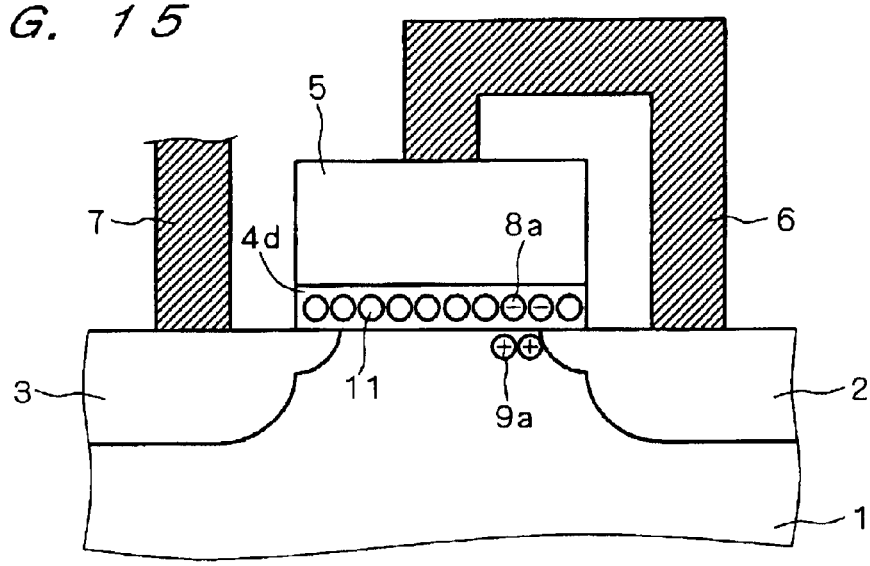
FIG. 15 is a diagram that shows a semiconductor device of a third preferred embodiment.

FIG. 15 is a diagram that shows a semiconductor device of this preferred embodiment. The structure shown in FIG. 15 is the same as that shown in FIG. 11 except that the gate insulating films 4a to 4c are replaced by a single-layer silicon oxide film 4d containing silicon dots 11.

The charged particles 8a are trapped in the silicon dots 11 so that the charge holding capability is enhanced as compared with that of the single-layer silicon oxide film. Therefore this structure, too, offers a semiconductor device that includes a MISFET diode having a current-voltage characteristic closer to that of the ideal diode.

<Fourth Preferred Embodiment>

This preferred embodiment describes various methods for trapping the charged particles in the gate insulating film. FIGS. 16 to 20 illustrate the various charge trapping methods.

Figure 16:
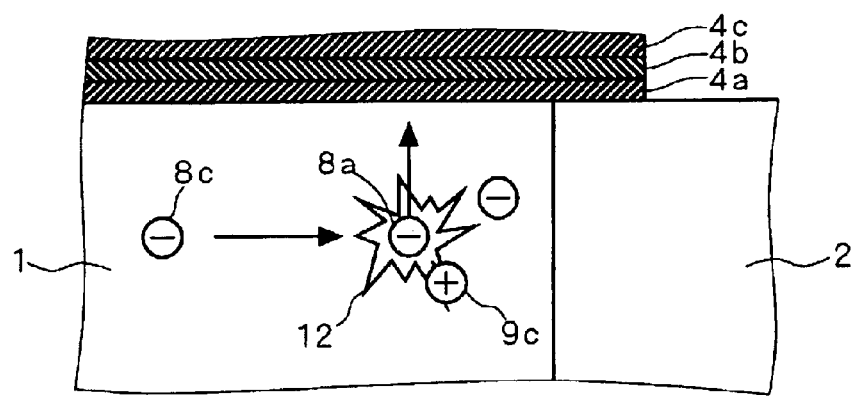
FIG. 16 is a diagram that shows a charged-particle trapping method called hot carrier degradation.

First, FIG. 16 shows a trapping method which utilizes a phenomenon called hot carrier degradation. In FIG. 16, a negatively charged particle (e.g. an electron) 8c traveling from the source region 3 toward the drain region 2 collides with an atom in the semiconductor substrate 1 and generates a hot carrier 8a and a hot hole 9c through impact ionization 12. The hot carrier 8a is thus injected into the silicon nitride film 4b.

The following shows an example of potential conditions in this process: gate potential Vg=3 [V], source potential Vs=0 [V], body potential Vb=0 [V], and drain potential Vd=the drain voltage at which the substrate current attains its maximum (about Vg/2 in n-channel MOS).

Figure 17:
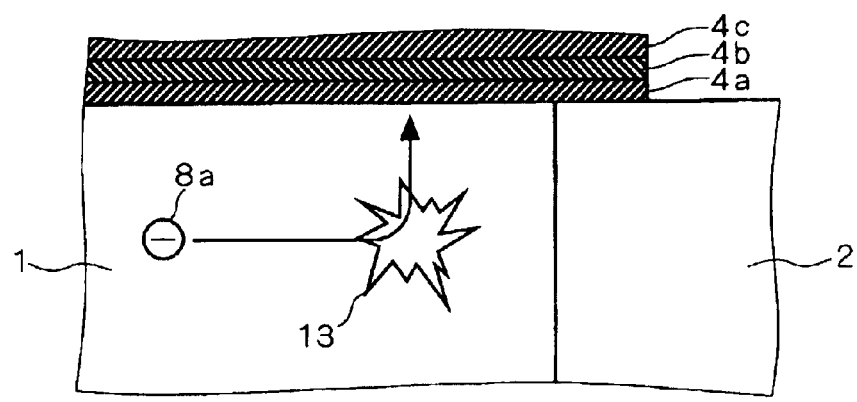
FIG. 17 is a diagram that shows a charged-particle trapping method called channel hot hole generation.

Next, FIG. 17 shows a trapping method which utilizes a phenomenon called channel hot hole generation. In FIG. 17, a negatively charged particle (e.g. an electron) 8a traveling from the source region 3 toward the drain region 2 collides with an atom in the semiconductor substrate 1 and gets trapped because of the scattering while generating a hot hole through impact ionization 13. The charged particle 8a is thus injected into the silicon nitride film 4b.

The following shows an example of potential conditions in this process: gate potential Vg=3 [V], source potential Vs=0 [V], body potential Vb=0 [V], and drain potential Vd≈Vg.

Figure 18:
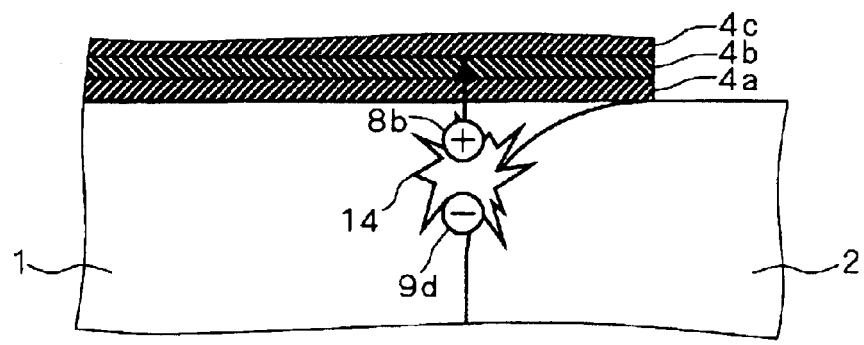
FIG. 18 is a diagram that shows a charged-particle trapping method called GIDL (Gate Induced Drain Leakage) generation.

Next, FIG. 18 shows a trapping method which utilizes a phenomenon called GIDL (Gate Induced Drain Leakage) generation. In FIG. 18, a high electric field is applied to the gate to decompose a stable atom 14 in the drain region 2 into a positively charged particle (hole) 8b to be trapped and a negative charged particle 9d. The charged particle 8b is thus injected into the silicon nitride film 4b.

The following shows an example of potential conditions in this process: gate potential Vg=−2 [V], source potential Vs=0 [V], body potential Vb=0 [V], and drain potential Vd=2 [V]. The film thickness of the gate insulating film is 6 [nm], for example.

Figure 19:
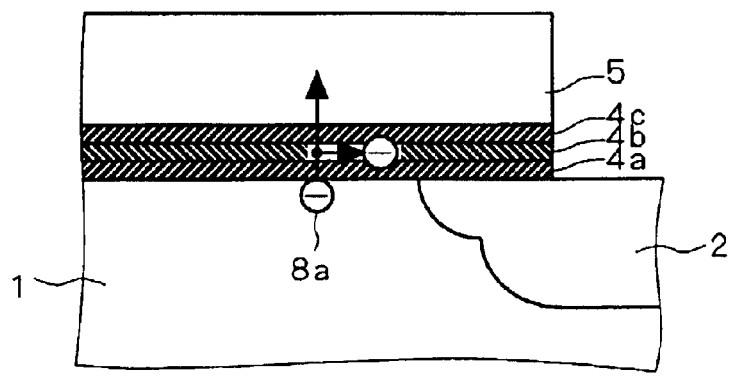
FIG. 19 is a diagram that shows a charged-particle trapping method called Fowler-Nordheim current generation.

Next, FIG. 19 shows a trapping method which utilizes a phenomenon called Fowler-Nordheim current generation. In FIG. 19, a high voltage is applied to the gate electrode to pull out negatively charged particles 8a into the gate electrode 5. The negatively charged particles 8a undergo scattering in the gate insulating film and part of them stay in the silicon nitride film 4b. The charged particles 8a are thus injected into the silicon nitride film 4b.

The following shows an example of potential conditions in this process: gate potential Vg=6 [V], source potential Vs=0 [V], body potential Vb=0 [V], and drain potential Vd=0 [V]. The thickness of the gate insulating film is 6 [nm], for example.

Figure 20:
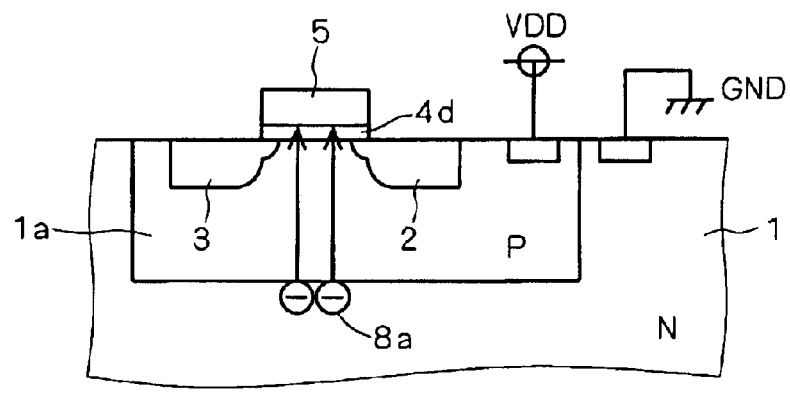
FIG. 20 is a diagram that shows a charged-particle trapping method called substrate hot carrier generation.

Finally, FIG. 20 shows a trapping method which utilizes a phenomenon called substrate hot carrier generation. In FIG. 20, a forward bias is applied near the pn junction between the semiconductor substrate 1 and a well 1a formed therein to generate negatively charged particles (e.g. electrons) 8a and a high voltage is applied to the gate electrode to accelerate them into the gate electrode 5. The charged particles 8a are thus injected into the silicon oxide film 4d.

The following shows an example of potential conditions in this process: gate potential Vg=2 [V], source potential Vs=0 [V], drain potential Vd=0 [V], well potential Vpw=0 [V], and substrate potential Vnw=−2 [V].

As shown above, the charged particles can be trapped through voltage application to one or ones of the gate electrode 5, the drain region 2, the source region 3 and the semiconductor substrate 1 to cause charged particles in the semiconductor substrate 1 to move. The charged particles can thus be trapped easily through voltage application to the portion(s) and the in-channel charged particles can hence be induced easily.

<Fifth Preferred Embodiment>

This preferred embodiment provides a semiconductor device in which impurities are implanted into the channel formation region to cause the in-channel charged particles to be present, instead of trapping charged particles in the gate insulating film as shown in the MISFET of the first preferred embodiment. More specifically, an impurity having a conductivity type different from that of the channel formed in the channel formation region is implanted so that the impurity concentration becomes higher on the drain region side than on the source region side in the channel formation region.

Figure 21:
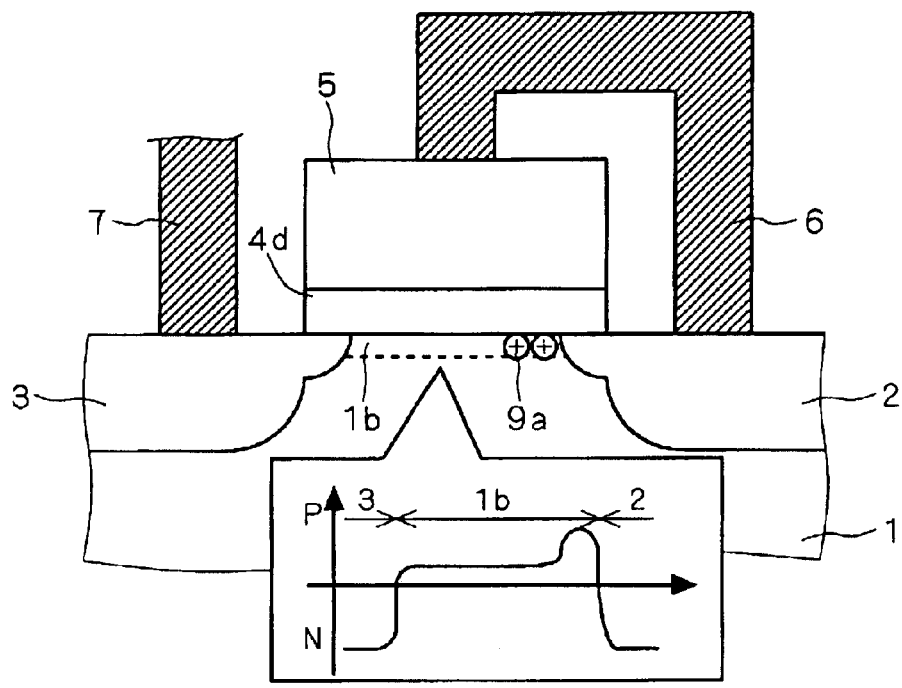
FIG. 21 is a diagram that shows a semiconductor device of a fifth preferred embodiment.

FIG. 21 is a diagram that shows a semiconductor device of this preferred embodiment. In FIG. 21, an impurity is implanted in the channel formation region 1b as shown in the graph, in place of trapping charged particles in the gate oxide film 4d. In the graph, the vertical axis shows the impurity concentration (the p-type impurity concentration in the upper half and the n-type impurity concentration in the lower half) and the horizontal axis shows the distance in the gate-length direction. The structure is the same as that of FIG. 14 in other respects.

The impurity implantation causes the in-channel charged particles 9a to be present to provide the same functions and effects as those shown in the first to third preferred embodiments. When the in-channel charged particles are caused by impurity implantation, the amount of charge of the in-channel charged particles 9a can be more precisely controlled by controlling the dose.

In this preferred embodiment, the implanted impurity has p conductivity type which is opposite to the conductivity type of the channel, n type, formed in the channel formation region 1b. Also, as shown in the graph of FIG. 21, the impurity concentration in the channel region is higher on the drain region 2 side than on the source region 3 side.

This allows a larger amount of in-channel charged particles 9a to occur on the drain region 2 side.

Figure 22:
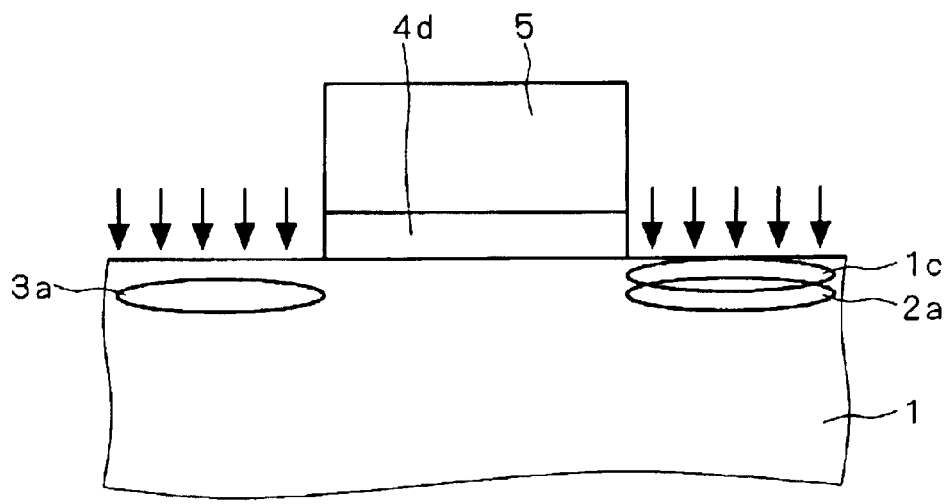
FIGS. 22 and 23 are diagrams that show a process for manufacturing the semiconductor device of the fifth preferred embodiment.
Figure 23:
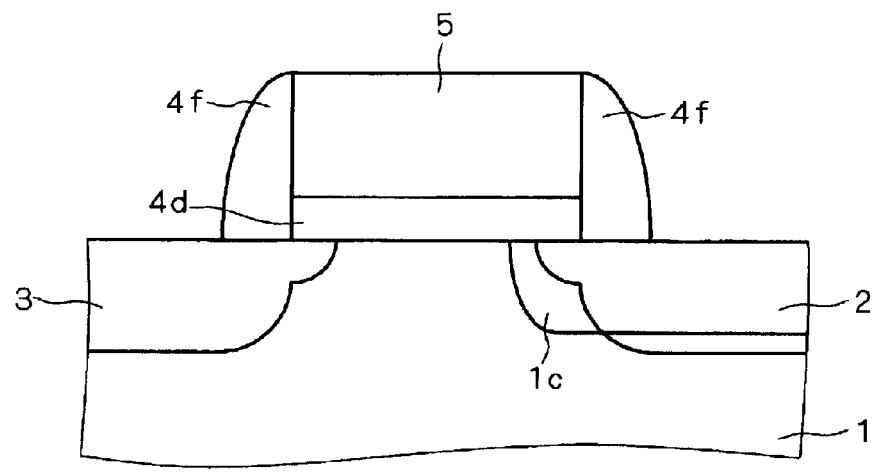

FIGS. 22 and 23 are diagrams that show a process for manufacturing the semiconductor device of FIG. 21. First, as shown in FIG. 22, the gate oxide film 4d and the gate electrode 5 are formed on the semiconductor substrate 1 and then phosphorus (P) is implanted for n⁻LDD (Lightly Doped Drain) region formation for the drain region 2 and the source region 3, thus forming implanted regions 2a and 3a. Then, in order to increase the p-type impurity concentration on the drain region side, boron (B) is pocket-implanted to form an implanted region 1c.

Subsequently, as shown in FIG. 23, side walls 4f are formed and a further impurity implantation is performed to form the drain region 2 and the source region 3. Thus the pocket-implanted region 1c having a higher p-type impurity concentration is formed on the drain region 2 side of the channel formation region.

<Sixth Preferred Embodiment>

This preferred embodiment is a variation of the fifth preferred embodiment, where the channel formation region, except the region of the in-channel charged particles 9a, is formed as a buried channel structure.

Figure 24:
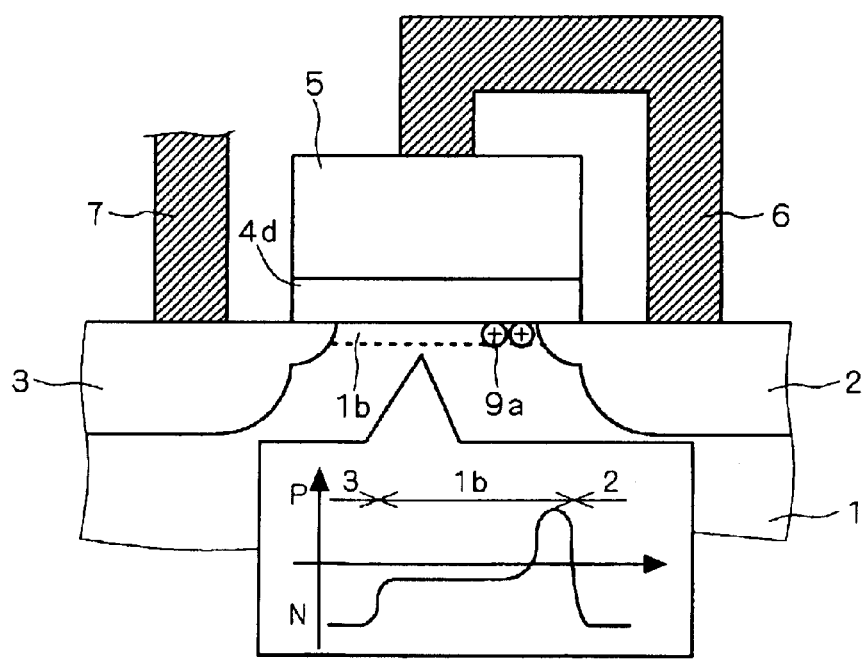
FIG. 24 is a diagram that shows a semiconductor device of a sixth preferred embodiment.

FIG. 24 shows a semiconductor device of this preferred embodiment. In FIG. 24, as shown in the graph, the channel formation region 1b is implanted with an n-type impurity except in the portion on the drain region 2 side. In other respects the structure is the same as that of FIG. 21.

This structure, too, offers the same functions and effects as those of the first to third preferred embodiments. When the in-channel charged particles are caused by impurity implantation, the amount of charge of the in-channel charged particles 9a can be more precisely controlled by controlling the dose.

In this preferred embodiment, the impurity implanted on the source region 3 side is of the same type as the channel, i.e. n-type. The channel formation region can thus be formed as a buried channel structure, with a larger amount of in-channel charged particles 9a present on the drain region 2 side.

Figure 25:
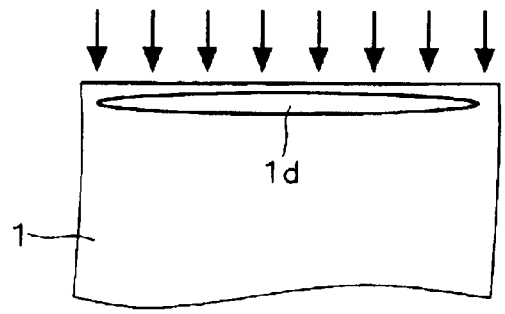
FIGS. 25 to 27 are diagrams that show a process for manufacturing the semiconductor device of the sixth preferred embodiment.
Figure 26:
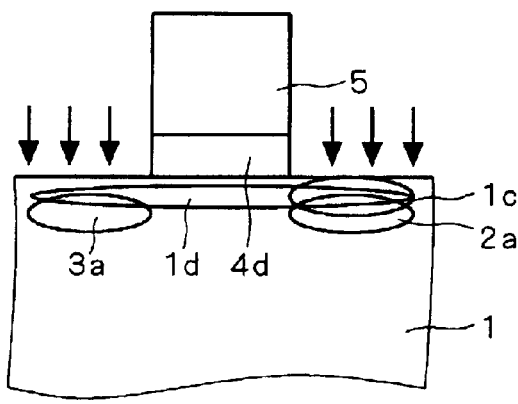
Figure 27:
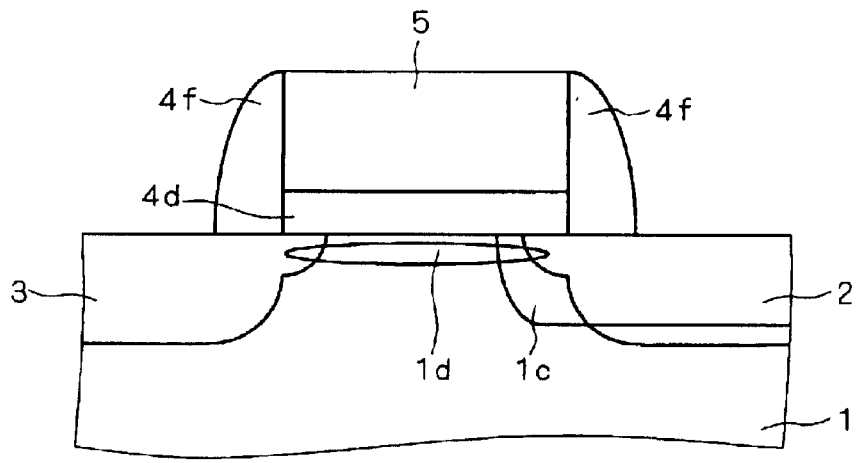

FIGS. 25 to 27 are diagrams that show a process for manufacturing the semiconductor device shown in FIG. 24. First, as shown in FIG. 25, phosphorus (P) is implanted to form a buried channel structure in the semiconductor substrate 1, thus forming an implanted region 1d. Next, as shown in FIG. 26, the gate oxide film 4d and the gate electrode 5 are formed on the semiconductor substrate 1 and then phosphorus (P) is implanted for n⁻LDD region formation for the drain region 2 and the source region 3, so as to form implanted regions 2a and 3a. Then, in order to obtain an increased p-type impurity concentration on the drain region side, boron (B) is pocket-implanted to form an implanted region 1c.

Subsequently, as shown in FIG. 27, the side walls 4f are formed and a further impurity implantation is performed to form the drain region 2 and the source region 3. The buried channel 1d can thus be formed in the channel formation region with the pocket-implanted region 1c having a higher p-type impurity concentration on the drain region 2 side.

<Seventh Preferred Embodiment>

Unlike the MISFET of the first preferred embodiment in which charged particles are trapped in the gate insulating film, the semiconductor device of this preferred embodiment has an electrically conductive region that is insulated from the gate electrode and charged particles are trapped in that conductive region to induce the in-channel charged particles. More specifically, the conductive region is an electrically conductive side wall formed on a side of the gate electrode; charged particles are trapped in this side wall.

Figure 28:
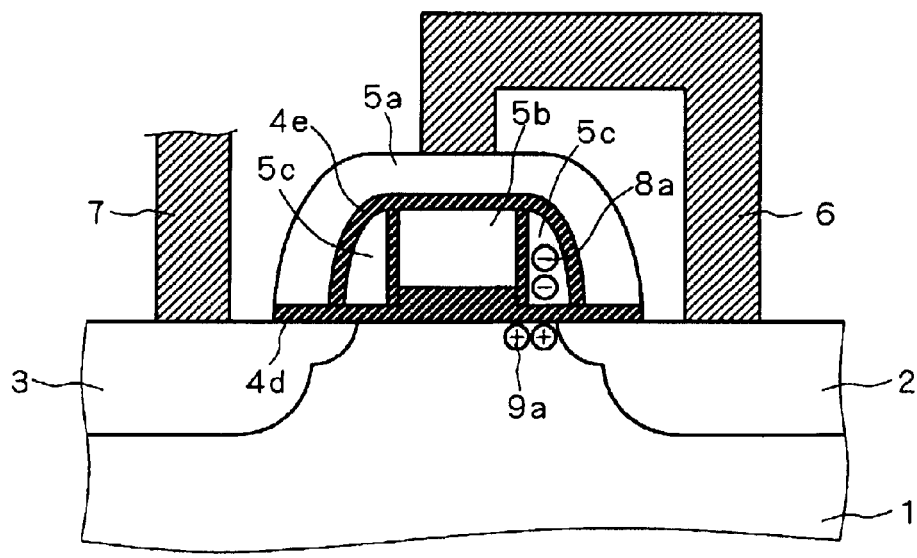
FIG. 28 is a diagram that shows a semiconductor device of a seventh preferred embodiment.

FIG. 28 is a diagram that shows a semiconductor device of this preferred embodiment. In FIG. 28, electrically conductive side walls 5c formed on the gate oxide film 4d are insulated from a floating gate electrode 5b. Charged particles 8a are trapped in the side wall 5c on the drain region 2 side. A control gate electrode 5a covers the floating gate electrode 5b and the side walls 5c with a silicon oxide film 4e sandwiched therebetween. In other respects the structure is the same as that shown in FIG. 14.

The charged particles 8a trapped in the side wall 5c cause the in-channel charged particles 9a to be present, offering the same functions and effects as the first to third preferred embodiments. This preferred embodiment is effective when injection of charged particles in the gate oxide film 4d is undesirable, since no charged particles are trapped in the gate oxide film 4d. The charged particles 8a can be fixed on the drain region 2 side since the side wall 5c is insulated from the floating gate electrode 5b.

The charged particles 8a can be trapped in the side wall 5c by the various methods shown in the fourth preferred embodiment.

<Eighth Preferred Embodiment>

In this preferred embodiment, as in the seventh preferred embodiment, the semiconductor device has an electrically conductive region that is insulated from the gate electrode and charged particles are trapped not in the gate insulating film but in this conductive region to induce the in-channel charged particles. More specifically, the conductive region is a split gate formed in part of the gate electrode while being insulated from the gate electrode; charged particles are trapped in this split gate.

Figure 29:
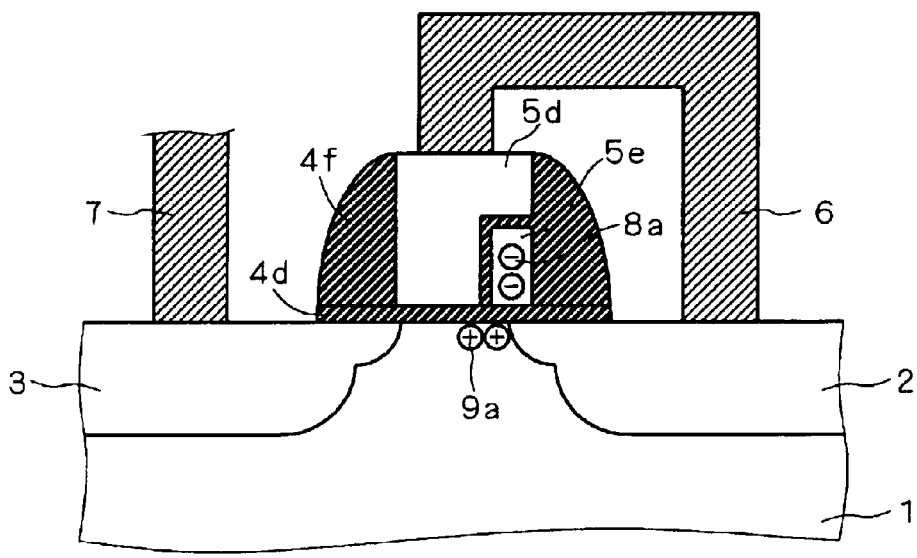
FIG. 29 is a diagram that shows a semiconductor device of an eighth preferred embodiment.

FIG. 29 is a diagram that shows a semiconductor device of this preferred embodiment. In FIG. 29, a split gate 5e, insulated from the gate electrode 5d, resides in part of the gate electrode 5d on the drain region 2 side. The charged particles 8a are trapped in the split gate 5e. In other respects the structure is the same as that shown in FIG. 14.

The charged particles 8a trapped in the split gate 5e cause the in-channel charged particles 9a, thus offering the same functions and effects as the seventh preferred embodiment. The charged particles 8a can be fixed on the drain region 2 side since the split gate 5e is insulated from the gate electrode 5d.

The charged particles 8a can be trapped in the split gate 5e by the various method shown in the fourth preferred embodiment.

<Ninth Preferred Embodiment>

This preferred embodiment describes methods for connecting the gate electrode and the drain region in the MISFET of the first preferred embodiment.

Figure 30:
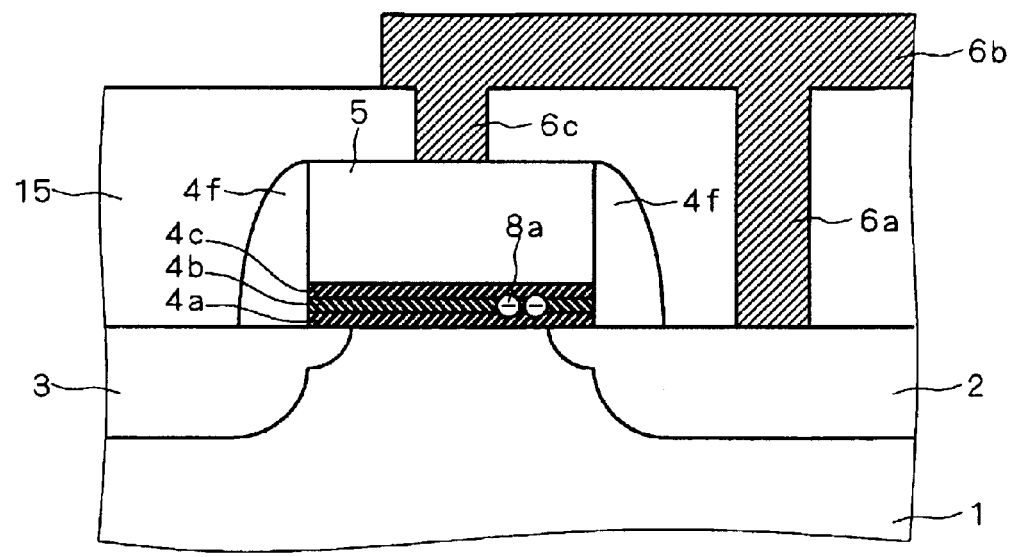
FIG. 30 is a diagram that shows a semiconductor device of a ninth preferred embodiment.

FIG. 30 is a diagram that shows a semiconductor device of this preferred embodiment. FIG. 30 shows the structure of the contact plug 6 of FIG. 11 in greater detail. That is to say, a via hole connected to the drain region 2 is formed in the interlayer insulating film 15 provided on the semiconductor substrate 1 and a contact plug 6a is formed in it. A contact plug 6c connected to the gate electrode 5 is formed in the same way. The contact plugs 6a and 6c are connected through an interconnection 6b on the interlayer insulating film 15.

Figure 31:
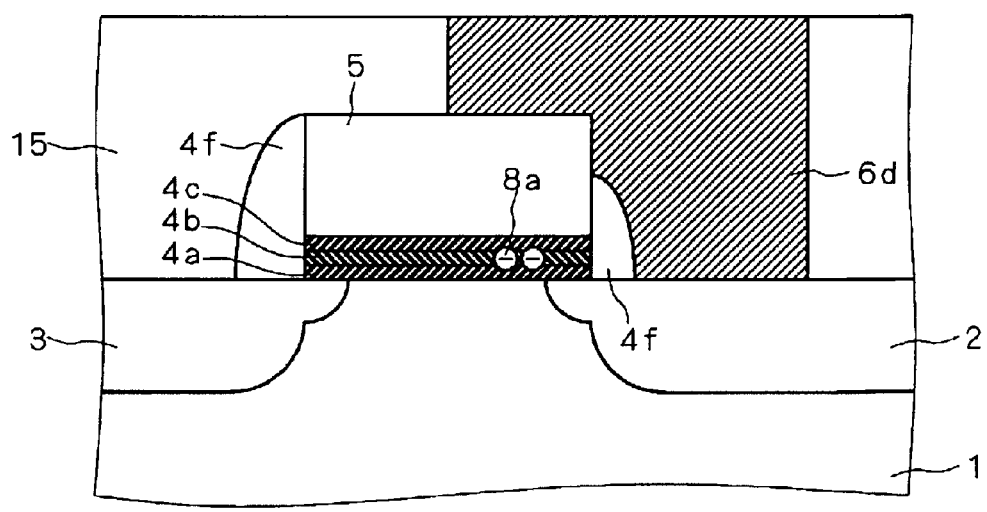
FIG. 31 is a diagram that shows another semiconductor device of the ninth preferred embodiment.

While the via hole connected to the drain region 2 and the via hole connected to the gate electrode 5 may be separately formed as shown in FIG. 30, a via hole that opens wide over the drain region 2 and the gate electrode 5 may be formed as shown in FIG. 31 with a single contact plug 6d filling it in the area from the gate electrode 5 to the drain region 2.

This eliminates the need for the separate via holes to the drain region 2 and to the gate electrode 5 and saves the contact area. This also eliminates the need for the interconnection 6b on the interlayer insulating film 15 and enables an easy-to-manufacture semiconductor device. Furthermore, the contact area between the contact plug 6d and the gate electrode 5 and the drain region 2 can be larger than that shown in FIG. 30, which lowers the contact resistance. The side wall 4f in the via hole is depicted as a somewhat smaller one, which represents the influence of etching for forming the via hole.

Figure 32:
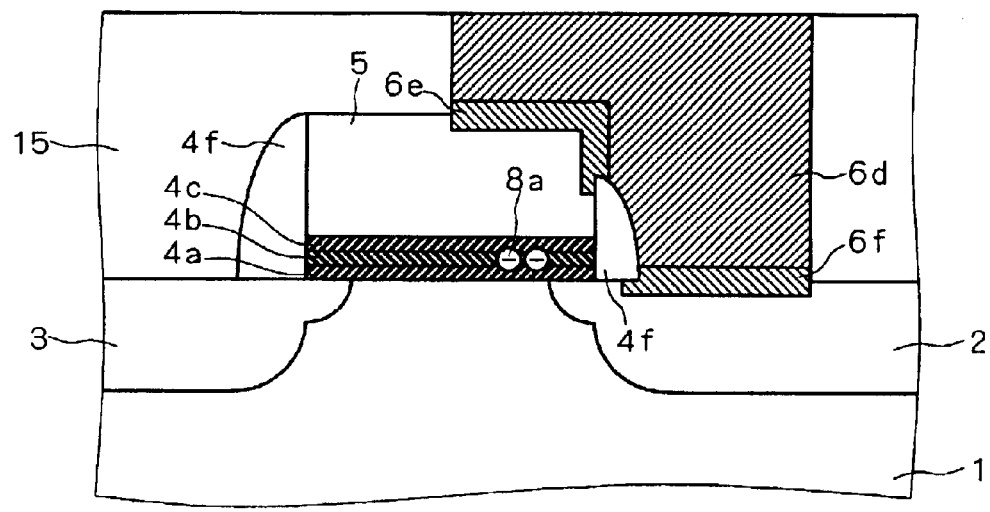
FIG. 32 is a diagram that shows another semiconductor device of the ninth preferred embodiment.

Also, as shown in FIG. 32, silicide layers 6e and 6f may be formed in the contact area between the drain region 2 and the contact plug 6d and in the contact area between the gate electrode 5 and the contact plug 6d. This further reduces the contact resistance.

Figure 33:
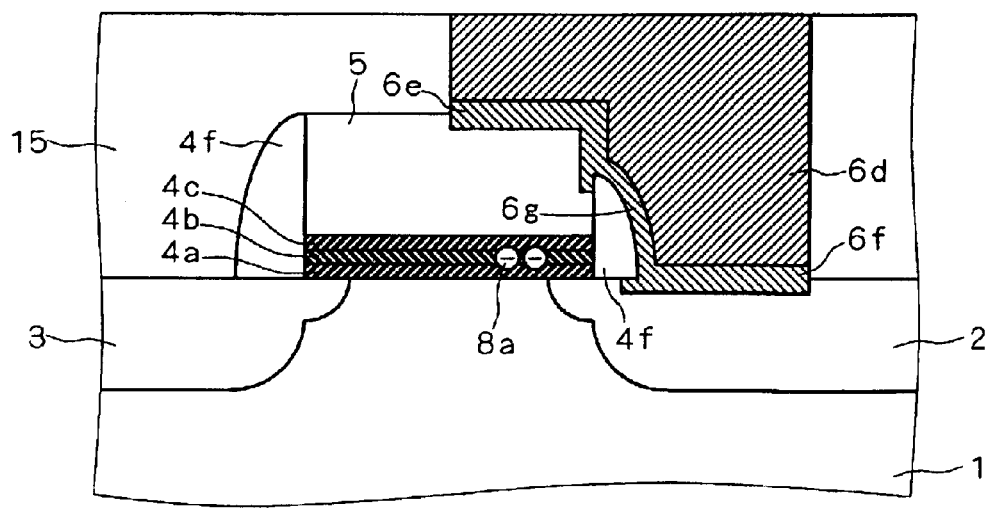
FIG. 33 is a diagram that shows another semiconductor device of the ninth preferred embodiment.

Alternatively, as shown in FIG. 33, a silicide layer 6g may be further formed on the side wall 4f to electrically connect the silicide layers 6e and 6f on the drain region 2 and the gate electrode 5 through the silicide layer 6g. During formation of the silicide layers 6e and 6f, they may be closely formed also on the side wall 4f. This structure utilizes this phenomenon to create a structure with still lower contact resistance.

<Tenth Preferred Embodiment>

This preferred embodiment describes how to set the threshold for channel formation in the MISFET of the first preferred embodiment.

Figure 34:
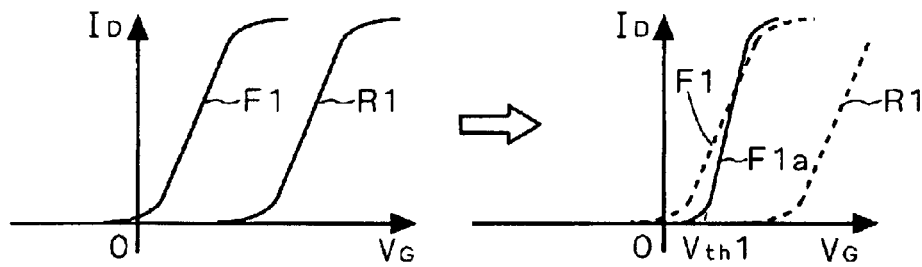
FIGS. 34 to 36 are diagrams that show the gate-source voltage $V_G$ versus drain-source current $I_D$ characteristic.

As shown in the left-hand graph in FIG. 34, and as mentioned about the art of U.S. Pat. No. 5,768,192, when the gate electrode 5 and the drain region 2 are not short-circuited in the MISFET of the first preferred embodiment, the threshold for channel formation of the MISFET differs depending on whether a forward bias or a reverse bias is applied. That is to say, it is now assumed that a drain-source voltage is applied to the MISFET of the first preferred embodiment, without short-circuiting the gate electrode 5 and the drain region 2. Then, the gate-source voltage $V_G$ exhibits a smaller threshold with a forward bias as shown by the graph F1 and exhibits a larger threshold with a reverse bias as shown by the graph R1, for example.

On the other hand, when the gate electrode 5 and the drain region 2 are short-circuited, as shown by the graph on the right side in FIG. 34, the inclination becomes steeper as shown by the graph F1a, which offers a desirable characteristic for use as a diode.

At this time, when the threshold Vth1 is set lower than the built-in potential of the pn-junction diode (e.g. 0.7 [V] in a silicon pn-junction diode), then the present invention can avoid the voltage loss which has been unavoidable for the pn-junction diode.

Figure 35:
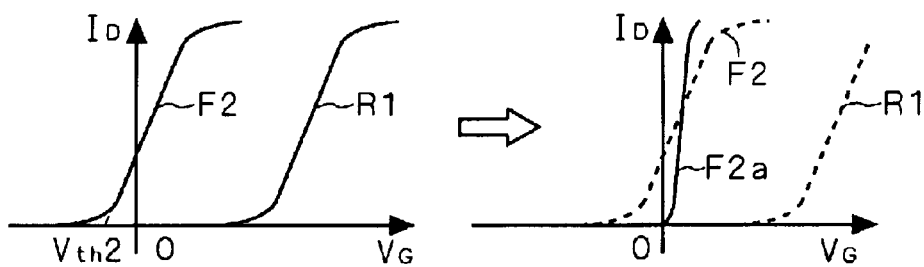

Further, referring to the graph F2 for forward bias on the left side in FIG. 35, suppose that, under the assumption made above, the threshold Vth 2 is located in the reverse bias region in the gate-source voltage $V_G$ versus drain-source current $I_D$ characteristic. Then, as shown by the graph F2a on the right side in FIG. 35, the device exhibits a voltage-current characteristic closer to that of the ideal diode in which the drain-source current $I_D$ rapidly increases as the voltage $V_G$ increases from zero. This is because the drain-source current $I_D$ can be suppressed to approximately zero in the reverse bias region, since with the reverse bias the channel formation is hindered by the in-channel charged particles 9a.

Thus, a voltage-current characteristic close to that of the ideal diode can be obtained by determining the conductivity type and the amount of charge of the in-channel charged particles so that the threshold Vth2 with the forward bias is located in the reverse bias region as shown by the graph F2.

Figure 36:
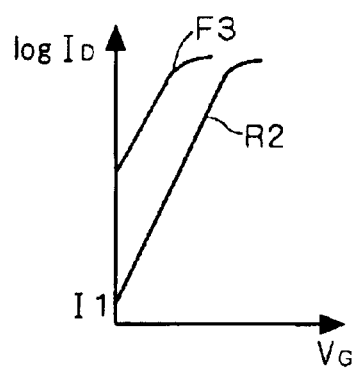
Figure 37:
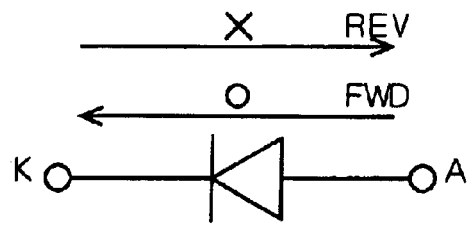
FIG. 37 is a diagram that shows a graphical symbol of the diode.

Now, for example, FIG. 36 shows the log-plot of only the vertical axis of the left-hand graph in FIG. 35. The graph F3 is a log representation of the graph F2 for forward bias and the graph R2 is a log representation of the graph R1 for reverse bias.

As the in-channel charged particles 9a induced on the drain region 2 side have a larger amount of charge, the channel formation blocking capability increases and the leakage current can be more effectively suppressed when the reverse bias is applied. That is to say, in the first preferred embodiment, for example, the leakage current can be suppressed lower as a larger amount of charge is trapped as the charged particles 8a. However, too large an amount of charged particles 8a trapped are more likely to leak out, causing variation in characteristics. It is then difficult to keep the threshold Vth2 constant.

It is determined by standards that the absolute value of the diode off-state current with reverse bias application should be under given value. Therefore a semiconductor device less likely to suffer characteristic variation can be obtained when the charged particles 8a are trapped to such an amount of charge that the standards are satisfied. That is to say, under the assumption made above, when the gate-source voltage of the MISFET is 0 [V], the drain-source current shall have an absolute value not more than a given standard value I1 as shown in the graph R2 in FIG. 36.

Thus a semiconductor device less likely to cause characteristic variation can be obtained when the conductivity type and the amount of charge of the in-channel charged particles are determined so that the absolute value of the current $I_D$ is not more than the standard value I1 when the voltage $V_G$=0 [V] as shown by the graph R2.

While the invention has been described in detail, the foregoing description is in all aspects illustrative and not restrictive. It is understood that numerous other modifications and variations can be devised without departing from the scope of the invention.

What is claimed is:

1. A semiconductor device comprising:
   a MISFET (Metal Insulator Semiconductor Field Effect Transistor),
   said MISFET comprising:
      a gate insulating film formed on a semiconductor substrate;
      a gate electrode formed on said gate insulating film; and
      a drain region and a source region formed in a main surface of said semiconductor substrate with said gate insulating film located between said drain region and said source region,
   wherein when no voltage is applied, in-channel charged particles are present in a channel formation region under said gate insulating film in said semiconductor substrate, said in-channel charged particles differing in at least one of a conductivity type and an amount of charge between a drain region side and a source region side in said channel formation region, and
   wherein said gate electrode and said drain region are short-circuited.

2. The semiconductor device according to claim 1, wherein said in-channel charged particles located on said drain region side have a conductivity type different from that of the channel formed in said channel formation region.

3. The semiconductor device according to claim 1,
   wherein charged particles are trapped in said gate insulating film and said in-channel charged particles are induced by said charged particles.

4. The semiconductor device according to claim 3, wherein said gate insulating film has a stacked-layer structure in which a silicon nitride film is sandwiched between silicon oxide films, and said charged particles are trapped in said silicon nitride film.

5. The semiconductor device according to claim 3, wherein said gate insulating film comprises a plurality of dots made of silicon and said charged particles are trapped in said dots.

6. The semiconductor device according to claim 3, wherein said charged particles are trapped through voltage application to one or ones of said gate electrode, said drain region, said source region, and said semiconductor substrate, so as to cause charged particles present in said semiconductor substrate to move.

7. The semiconductor device according to claim 1, further comprising an electrically conductive region formed on said gate insulating film and insulated from said gate electrode, wherein charged particles are trapped in said electrically conductive region and said in-channel charged particles are induced by said charged particles.

8. The semiconductor device according to claim 7, wherein said charged particles are trapped through voltage application to one or ones of said gate electrode, said drain region, said source region, and said semiconductor substrate, so as to cause charged particles present in said semiconductor substrate to move.

9. The semiconductor device according to claim 7, wherein said electrically conductive region is a conductive side wall formed on a side of said gate electrode.

10. The semiconductor device according to claim 7, wherein said electrically conductive region is a split gate formed in part of said gate electrode and insulated from said gate electrode.

11. The semiconductor device according to claim 1, wherein said in-channel charged particles are caused to be present by implanting an impurity into said channel formation region.

12. The semiconductor device according to claim 11,
wherein said implanted impurity has a conductivity type different from that of the channel formed in said channel formation region, and
said impurity has a higher concentration on said drain region side than on said source region side in said channel formation region.

13. The semiconductor device according to claim 11,
wherein said impurity implanted on said drain region side has a conductivity type different from that of the channel formed in said channel formation region, and
an impurity having a same conductivity type as said channel is implanted in said channel formation region except on said drain region side.

14. The semiconductor device according to claim 1, further comprising a contact plug which is continuous in an area from said gate electrode to said drain region.

15. The semiconductor device according to claim 14, wherein silicide layers are formed in a contact portion between said gate electrode and said contact plug and in a contact portion between said drain region and said contact plug.

16. The semiconductor device according to claim 15,
wherein a side wall is formed on a side of said gate electrode,
another silicide layer is formed on said side wall, and
said another silicide layer electrically connects the silicide layers on said drain region and on said gate electrode.

17. The semiconductor device according to claim 1, wherein the conductivity type and the amount of charge of said in-channel-charged particles are determined so that, when a forward bias voltage is applied as a drain-source voltage with said gate electrode and said drain region not short-circuited, said MISFET exhibits a channel formation threshold located in a reverse bias region of a gate-source voltage versus drain-source current characteristic.

18. The semiconductor device according to claim 1, wherein the conductivity type and the amount of charge of said in-channel charged particles are determined so that, when a reverse bias voltage is applied as a drain-source voltage with said gate electrode and said drain region not short-circuited, said MISFET produces a drain-source current having an absolute value not more than a given value with a gate-source voltage equal to 0.

* * * * *